United States Patent [19]

Zwack

[11] 3,984,829
[45] Oct. 5, 1976

[54] CIRCUIT ARRANGEMENT FOR CONVERTING ANALOG SIGNALS INTO PCM SIGNALS AND PCM SIGNALS INTO ANALOG SIGNALS

[75] Inventor: Eduard Zwack, Munich, Germany

[73] Assignee: Siemens Aktiengesellschaft, Munich, Germany

[22] Filed: June 25, 1974

[21] Appl. No.: 482,890

[30] Foreign Application Priority Data
June 29, 1973 Germany............................ 2333299

[52] U.S. Cl. ...................... 340/347 C; 179/15 AV; 340/347 AD; 340/347 DA
[51] Int. Cl.² ...................................... H03K 13/02
[58] Field of Search .. 340/347 AD, 347 C, 347 DA; 179/15 AV; 235/197

[56] References Cited
UNITED STATES PATENTS

| | | | |
|---|---|---|---|
| 2,715,678 | 8/1955 | Barney............................ | 340/347 C |
| 2,865,564 | 12/1958 | Kaiser et al..................... | 340/347 C |
| 3,065,422 | 11/1962 | Villars............................. | 340/347 C |
| 3,105,230 | 9/1963 | MacIntyre...................... | 340/347 C |
| 3,251,052 | 5/1966 | Hoffman et al................. | 340/347 C |
| 3,414,818 | 12/1968 | Reidel ........................... | 340/347 NT |
| 3,449,741 | 6/1969 | Egerton.......................... | 340/347 C |
| 3,510,868 | 5/1970 | Chatelon...................... | 340/347 AD |
| 3,540,037 | 11/1970 | Ottesen.......................... | 340/347 C |
| 3,573,795 | 4/1971 | Bowers et al. ................ | 340/347 AD |
| 3,653,035 | 3/1972 | Carbrey......................... | 340/347 C |
| 3,760,407 | 9/1973 | Terry............................. | 340/347 NT |
| 3,883,864 | 5/1975 | Thomas......................... | 340/347 AD |
| 3,900,844 | 8/1975 | Wald.............................. | 340/347 C |
| 3,905,028 | 9/1975 | Wintz et al.................... | 340/347 AD |

Primary Examiner—Thomas J. Sloyan
Attorney, Agent, or Firm—Gerald L. Lett

[57] ABSTRACT

A circuit arrangement is described for converting pulse amplitude modulated (PAM) signals into pulse code modulated (PCM) signals and vice versa utilizing a nonlinear bend characteristic, rather than carrying out a linear conversion. A voltage having a value which varies in time in accordance with the foregoing characteristic is compared with the analog signal. A detected correspondence as a result of the comparison causes the operation of a memory circuit, which continually stores a code train corresponding to the amplitude of the aforementioned voltage, to be stopped. This produces a train of bits which is the PCM equivalent of the analog signal. For converting PCM signals into PAM signals a voltage is generated which has an amplitude characteristic corresponding to the nonlinear bend characteristic. A function generator produces a voltage which has a wave shape corresponding to the nonlinear characteristic. The function generator is triggered from a clock actuated register in which is registered a code train corresponding to the instantaneous amplitude in accordance with the nonlinear characteristic. A digital comparator compares the register output to the PCM signal to be converted. Upon detection of correspondence between the digital values in the register and the PCM signal, the instantaneous value of the function generator output is emitted, and such signal values occurring over a period of time form the analog or PAM signal.

8 Claims, 1 Drawing Figure

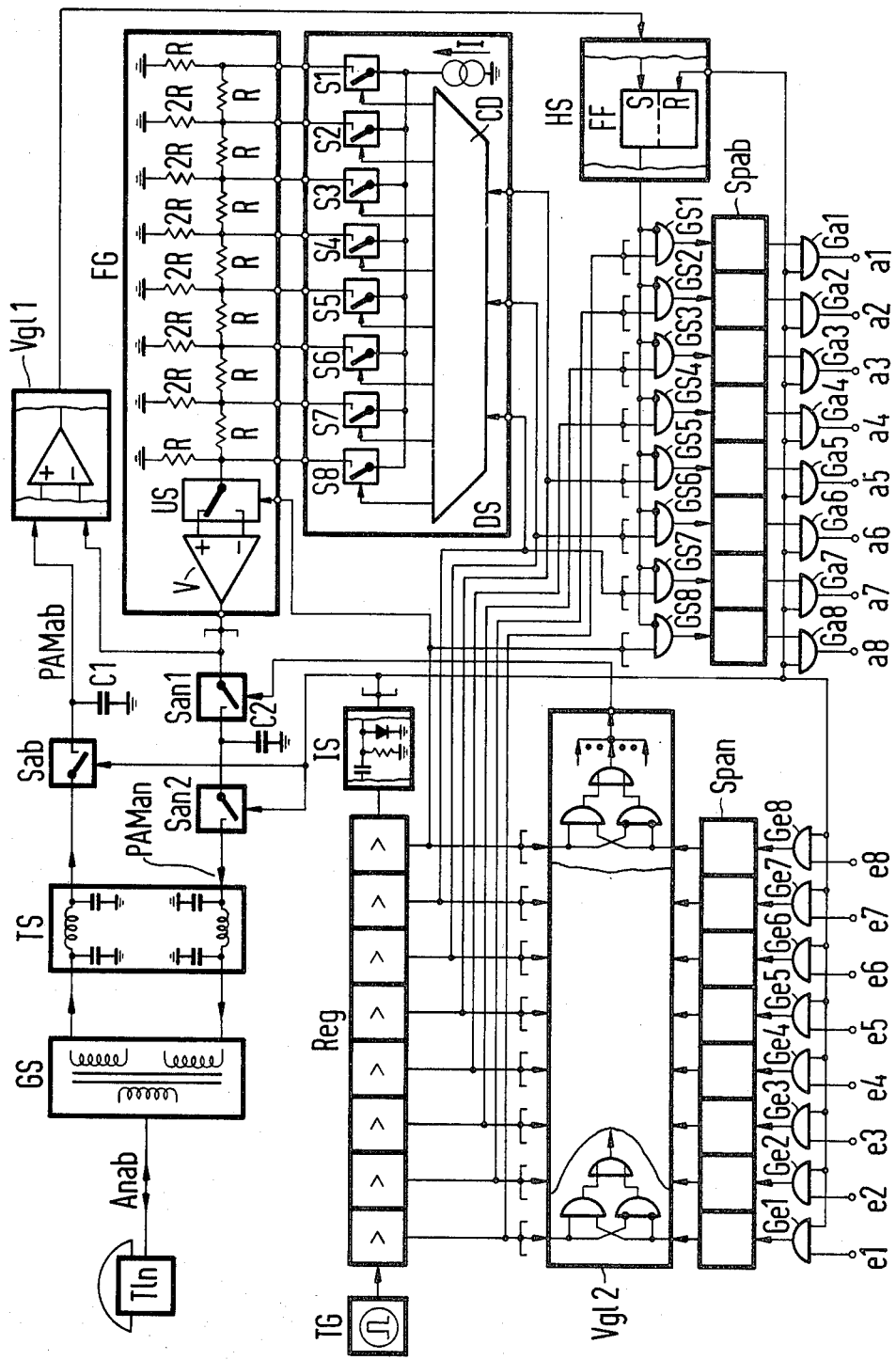

CIRCUIT ARRANGEMENT FOR CONVERTING ANALOG SIGNALS INTO PCM SIGNALS AND PCM SIGNALS INTO ANALOG SIGNALS

BACKGROUND OF THE INVENTION

When transmitting communication signals between a master station and a slave station, signals present in analog form must frequently be transmitted in digital form over transmission circuits connecting the master station with the slave station. These communication signals are frequently transmitted in pulse code modulated (PCM) form over the relevant transmission circuit. Before the communication signals are in this form, i.e., before they appear as PCM signals, they are frequently available in the pulse amplitude modulated (PAM) form initially. In PAM form, the PCM signals transmitted over the transmission circuit must be relayed at the receiver.

In connection with the conversion of PAM signals into PCM signals and of PCM signals into PAM signals, a commonly known technique (West German Unexamined Pat. application No. 2 024 963) is to carry out the conversion in accordance with the shape of a nonlinear bend characteristic, rather than carrying out a linear conversion. This conversion is accomplished at the transmitter in accordance with the shape of a companding (i.e. compressed and expanded) characteristic and at the receiver in accordance with the shape of an expansion characteristic. The PAM signals are fed to one input of a comparator, to the other input of which is fed the output voltage of a coder. The output of this coder varies in response to the coupling of a linearly varying input voltage in accordance with a logarithmically varying quantization characteristic. The control of the delivery of the output voltage from the coder takes place from a code control which, in addition, controls the counting operation of a counter. The counter position represents the code chain corresponding to the relevant instantaneous amplitude of the output voltage of the coder. In case of correspondence between the amplitude of the PAM signal and the output signal of the coder, the operation of the counter is stopped.

The counter position of the counter is then transmitted as the PCM signal corresponding to the aforesaid PAM signal. This PCM signal is introduced into a shift register at the receiver; this triggers a decoder over a code control. This decoder delivers an output signal in response to this triggering concerned, the output signal varying in accordance with the shape of an oppositely directed expansion characteristic matching the aforesaid companding characteristic. When an amplitude of the output voltage of the decoder corresponding to the code chain of the PCM signal is attained, the output voltage thereof is delivered at the receiver as a PAM signal corresponding to the PCM signal.

Although in the prior art circuit arrangment described hereinabove, PAM signals can be converted into PCM signals, account being taken of a companding characteristic, and PCM signals can be converted into PAM signals, account being taken of an oppositely directed expansion characteristic, the required circuit complexity is fairly great. This is particularly evident if one considers employing the arrangements referenced above in a communication system in which each of the individual message centers has a master station and a slave station. In this case, both prior art arrangements mentioned hereinabove must be provided for each such message center.

It is an object of the invention to provide a method of converting analog signals into PCM signals and PCM signals into analog signals with comparatively less circuit complexity than in prior art circuits, such as the one described above.

SUMMARY OF THE INVENTION

In accordance with the principles of the invention, the foregoing and other objects are achieved in a circuit arrangement for converting analog signals, formed particularly by PAM signals, into PCM signals, taking account of a nonlinear bend characteristic, and for converting PCM signals into analog signals, particularly into PAM signals, taking account of a nonlinear bend characteristic. For the conversion of the analog signals into PCM signals a voltage, which is variable with time in accordance with the shape of the nonlinear bend characteristic, is compared in an analog comparator with the relevant analog signal. In case of correspondence between the relevant analog signal and the output voltage, the analog comparator stops a memory circuit which continually stores a code train corresponding to the amplitude of the aforesaid output voltage. For the conversion of the PCM signals into analog signals a voltage is used which has an amplitude characteristic corresponding to the nonlinear bend characteristic.

In accordance with the invention there is furnished a single function generator which is capable of delivering a time-varying voltage corresponding in shape to the nonlinear bend characteristic. For the delivery of the latter voltage the function generator is triggered from a multistage register in which is found a code train corresponding to the amplitude of the voltage in question. A digital comparator is connected to the register for comparing the PCM signals to be converted into analog signals with all the possible code trains appearing in the register. Upon the detection of a correspondence between the relevant PCM signal and one of said code trains, the digital comparator causes the delivery of the voltage of the function generator available at that instant as an analog signal.

The invention has the advantage that only a single function generator and a single register need by used for the conversion of PCM signals into analog signals and the conversion of analog signals into PCM signals. Moreover, simultaneously with the conversion of an analog signal into a PCM signal, a PCM signal can also be converted into an analog signal by means of the function generator and the register. Another advantage is that the register and function generator can be employed, not only for one master/slave station operation for delivering analog signals to be converted into PCM signals and receiving analog signals in response to PCM signals fed thereto, but at the same time, for a multiplicity of such master/slave stations, which results in very few circuit elements.

According to an advantageous development of the invention, the function generator output is connected to a capacitor over a switch that can be controlled by the digital comparator, and this results in a comparatively small amount of circuitry for the provision of the output voltage of the function generator corresponding to the PCM signal to be converted into an analog signal.

According to a further advantageous development of the invention, the capacitor is connected over another switch to the receiving end of a subscriber line circuit. This other switch can be operated by pulses delivered from the register which succeed one another at the same interval of time at which the PCM signals to be converted into analog signals appear. This results in the advantage that one is able to forward the analog signal corresponding to the relevant PCM signal at the instant when time periods appear that pertain to a time slot allotted to the relevant master/slave station for the signal deliver/pickup with a cycled time period appearing in successive pulse frames.

According to another advantageous development of the invention, the analog comparator accepts the analog signals to be converted into PCM signals over a switch which can be operated by pulses delivered from the register. The pulses succeed one another at the same interval of time at which the PCM signals appear. This results in the advantage that one can feed the analog signals delivered from the relevant master/slave station directly to the analog comparator at the moment they are delivered.

According to still another advantageous development of the invention, there is provided a dynamic storage which has an input connected at the incoming end via a store-in control circuit to the output of the register and at the outgoing end via a store-out control circuit to a PCM transmission circuit. The store-in control circuit has an address memory which, in reaction to the delivery of an output signal from the analog comparator, prevents a further storage of signals of the register in the dynamic storage until the appearance of the next pulse (delivered from the register) of those pulses succeeding one another at the same time interval with which the PCM signals to be converted into analog signals appear. The store-out circuit switches the output side of the dynamic storage through to the PCM transmission circuit each time one of the last-mentioned pulses appears. As a result, a very small amount of circuitry is needed for holding the PCM signal corresponding the the analog signal in question prior to a delivery to the PCM transmission circuit.

According to another advantageous development of the invention, the PCM signals to be converted into analog signals are stored in another dynamic storage connected at its output to the digital comparator via a store-in control circuit which, in reaction to the acceptance of pulses succeeding one another at the same interval of time at which the relevant PCM signals appear, can be controlled to the transferable state. The other dynamic storage is connected at its output to inputs of the digital comparator. As a result, a very small amount of circuitry is needed for the buffering of the PCM signals to be converted in each case.

According to still another advantageous development of the invention, the function generator can be triggered solely by code bits for the delivery of the output voltages which correspond to the quantization bits indicating the sign bit and the amplitude range of a voltage of a PCM signal, taking the nonlinear bend characteristic as a basis. This results in a small amount of circuitry for the function generator.

According to still another advantageous development of the invention, the function generator is triggered by the aforesaid code bits via a decoder circuit. The result is a very simple constructional design of the function generator.

BRIEF DESCRIPTION OF THE DRAWING

The principles of the invention will be more readily understood by reference to the description of a preferred embodiment given hereinbelow in conjunction with the accompanying single figure drawing which is a schematic diagram of a circuit arrangement constructed according to the invention.

DETAILED DESCRIPTION OF THE DRAWING

The circuit arrangement shown in the Figure serves to convert the analog signals received from subscriber stations, such as the subscriber station Tln, into PCM signals and to convert PCM signals received for the subscriber stations into analog signals, which are then coupled to the subscriber stations concerned. For the conversion of analog signals into PCM signals and of PCM signals into analog signals, a nonlinear bend characteristic will be taken into consideration in each case, i.e., as a companding characteristic in the case of conversion of analog signals into PCM signals, and as an expansion characteristic in the case of conversion of PCM signals into analog signals, with both characteristics running complementarily to one another.

To satisfy the aforesaid conversion functions, the circuit arrangement illustrated in the drawing uses a binary counter Reg which is triggered from a clock generator TG. This counter has a number of counter stages corresponding to the number of bits constituting a PCM signal or a PCM word. In the present case, it is assumed that a PCM signal consists of eight bits; accordingly, the counter Reg consists of eight counter stages. The counter stages are interconnected so that the counter Reg works as a purely binary frequency scaler. The clock pulse frequency of the clock pulses delivered from the clock generator TG is selected such that within a time period between the appearacne of two consecutive PCM signals the binary counter Reg takes all possible positions. If one assumes, for example, that teh interval of time of the appearance of consecutive PCM signals is 125 microseconds, the clock generator TG can deliver pulses having a frequency of 2.048 MHz to the counter Reg, which carries out a frequency scaling according to a 1:2 ratio.

All the counter stages of the counter Reg have outputs connected to certain inputs of a digital comparator V$gl$ 2, which is a digital comparator. The other inputs of the digital comparator are connected to outputs of a storage Span designed in this case as a dynamic storage.

The term dynamic storage is to be understood to refer to a storage that stores a unit of information fed thereto for a certain duration, for example, 125 microseconds. In the described embodiment loading storage capacities of semiconductor components are utilized, particularly MOS FET components. The dynamic storage Span has a number of memory stages corresponding to the number of bits constituting a PCM signal. In the present case, there are eight memory stages. Corresponding stages of the counter Reg and of the dynamic storage Span are compared with one another with respect to their contents.

The digital comparator V$gl$ 2 is, for example, composed of exclusive OR elements, as shown in the drawing, which deliver signals "1" when the coincidence of all the compared bits is met. The dynamic storage Span is connected at its input to a store-in control circuit comprising AND elements G$e$1, G$e$2, G$e$3, G$e$4, G$e$5, G$e$6, G$e$7 and G$e$8 having outputs separately connected to the individual storage stages. The AND elements $Ge1$ to $Ge8$ have, respectively, one input connected to input terminals $e1$, $e2$, $e3$, $e4$, $e5$, $e6$, $e7$, or $e8$ which are connected with a corresponding number of PCM lines forming an incoming PCM transmission circuit. The other inputs of the AND elements $Ge1$ and $Ge8$ are connected, respectively, through an adjustable delay circuit, where necessary.

A pulse-shaping circuit Is is provided, which include a differentiating circuit comprising one capacitor and one resistor to the resistor of which a diode is connected in parallel. The pulse-shaping circuit Is is so designed that it delivers an output pulse in reaction to the appearance of a negative signal jump in the last register state of the register Reg, the duration of said output pulse corresponding to the time interval of two consecutive pulses from the clock generator TG. This signifies that every 125 microsecond there appears at the output of the pulse-shaping circuit Is a pluse "1", in reaction to which the aforesaid AND elements $Ge1$ to $Ge8$ become switchable. This will be explained in more detail hereinbelow. The pulseshaping circuit may be dispensed with as necessary, if instead of the pulse delivered by it, corresponding external control or synchronization pulses are used.

The outputs of all the counter stages of the counter Reg are, furthermore, connected through a store-in control circuit comprised of blocking elements GS1, GS2, GS3, GS4, GS5, GS6, GS7, GS8, to the inputs of the memory stages of another dynamic storage Spab. The outputs of the register Reg are connected to signal inputs of the blocking elements GS1 to GS8. The dynamic storage Spab, which is, for example, constructed like the dynamic storage Span and contains a number of memory stages corresponding to the number of bits forming a PCM signal. The outputs of all the memory stages of the storage Spab are, respectively, connected to an input of an AND element $Ga1$, $Ga2$, $Ga3$, $Ga4$, $Ga5$, $Ga6$, $Ga7$ or $Ga8$. The other inputs of all the other previously mentioned AND elements $Ga1$ to $Ga8$ are jointly connected to the output of the aforementioned pulse-shaping circuit Is, where necessary, over an adjustable delay circuit. The outputs of the AND elements $Ga1$ to $Ga8$ are connected to connecting terminals $a1$, $a2$, $a3$, $a4$, $a5$, $a6$, $a7$ or $a8$ of PCM lines associated with an outgoing PCM transmission circuit.

The blocking inputs of the aforesaid blocking elements GS1 to GS8 are jointly connected to the output of a holding circuit HS which in its simplest form may be constituted by a flip-flop FF, one output of which, i.e., the output carrying a signal "1" when the flip-flop is set, is connected to the blocking inputs of the blocking elements GS1 to GS8. The flip-flop FF has its reset input R connected to the output of the aforesaid pulse-shaping circuit Is, thereby causing the flip-flop FF to be reset every 125 microseconds. The set input S of the flip-flop FF is connected, where necessary, directly to the output of an analog comparator $Vgl1$, the function of which will be discussed hereinbelow.

The four register stages which are to be considered as the last four register stages of the register Reg referred to the terminal of the clock generator TG, are furthermore connected to a function generator FG. The last register stage of the register Reg, i.e., the register stage disposed farthermost to the right in the drawing, is directly connected to the function generator FG, while the outputs of the three register stages of the register Reg immediately adjoining the outputs of the last register stage are connected to the function generator FG over a decoder circuit Ds. The decoder circuit Ds includes a control decoder CD of known construction, the outputs of which triggers the operating inputs of eight switches S1, S2, S3, S4, S5, S6, S7 or S8. The switches S1 to S8 may be electronic switches. The switches S1 to S8 are jointly connected to one terminal of a constant-current source I. The other terminals of switches S1 to S8 are individually connected to separate junction points of a ladder network in the form of a $\pi$ circuit. All the shunt resistors of the ladder network have one and the same resistance value 2R except for the shunt resistors disposed in the outermost paths of the ladder network, which have the resistance value R. Each of the series resistors in the ladder network has the resistance value T. As a result of this design of the resistors of the ladder network, the voltage applied to one of the aforesaid junction points is lowered to half the value available at the junction point, because of a constant current fed from the constantcurrent source I to the junction point of resistors of the ladder network segment directly adjacent to the junction point concerned. The output voltage applied to the output of the ladder network is made up of the sum of the voltages which are available because of the constant currents fed to the individual junction points of the resistors of the ladder network. The output voltage exhibits a nonlinear characteristic when constant currents are fed successively to all the junction points of the resistors of the ladder network starting from the ladder network end facing the output of the ladder network. The characteristic thus provided has a shape such as frequently desired for converting PCM signals into analog signals or analog signals into PCM signals (see e.g. FIG. 1 of West German Unexamined Pat. application No. 1 537 970).

The output voltage of the ladder network considered above is fed to the changeover input of a selector switch US employed to switch the polarity of the output voltage delivered from the ladder network in reaction to the "0" or "1" bit supplied from the last (i.e., the rightmost in the drawing) stage of the register. The operating input of the selector switch US is connected to the output of the last register stage of the register Reg. The selector switch US is connected to two changeover inputs, each of which is connected to the changeover input, to one input of an amplifier V. This amplifier relays the signals fed thereto in non-inverted form at an input marked with a plus sign and delivers the signals fed thereto in inverted form at its other input marked with a minus sign. The amplifier V, which is, for example, an integrated amplifier, delivers an output voltage in response to its being triggered. The output voltage is made up of the constant currents in rectilinear segments corresponding to the resistor-ladder network, of which neighboring segments are distinguished from one another by a factor 2, insofar as their slope is concerned. The constant-current source I may be provided in a number corresponding to the number of switches S1 to S8, each of the switches S1 to S8 being connected in series to such a constant-current source One input of the aforesaid analog comparator $Vgl1$ is connected to the output of the amplifier V and, thereby, to the output of the function generator FG. The other input of the analog comparator $Vgl1$, which compares analog signals, is connected over an interexchange trunk $PAMab$ to an output of a low pass filter TS associated with a subscriber line circuit. The operating input of a switch Sab which connects the comparator to the low pass circuit, is connected to the output of the pulse-shaping circuit Is. Furthermore, a capacitor C1 is connected to the line PAMab carrying, in the present case, pulse-amplitude modulated signals. The capacitor C1, whose other terminal is grounded, stores the signals fed thereto when the switch Sab is closed, until a new signal is fed thereto over the switch Sab, when it is closed again.

The output of the function generator PG which may also be realized differently (cf. for example West German Unexamined Pat. specification No. 2 011 056), is furthermore connected over two series-connected switches San1 and San2 to one input of the low pass filter TS. The switch San1 has an operating input connected to the output of the digital comparator Vgl2; the switch San2 has an operating input connected to the output of the pulse-shaping circuit Is. A capacitor C2 has one terminal connected to the interexchange trunk linking both switches San1 and San2 which, as will be explained further below, permits the buffering of the signal voltages delivered from the output of the function generator Fg with the switch San in closed condition. The other terminal of the capacitor C2 is grounded.

The low pass circuit Ts has another input and another output connected to a hybrid circuit CS, likewise associated with a subscriber line circuit, a subscriber station Tln being connected to the hybrid circuit GS over an interexchange trunk Anab. A four-wire/two-wire conversion takes place from the low pass filter TS by means of the hybrid circuit GS.

The mode of operation of the circuit described above will now be discussed.

Let it first be assumed that an analog signal emitted from the subscriber station Tln must be converted into a PCM signal, account being taken of a nonlinear bend characteristic. The analog signal passes through the interexchange trunk Anab, as well as through the hybrid circuit GS and the low pass filter TS to one terminal of the switch Sab. This switch is closed every 125 microseconds under the control of an output of the pulse-shaping circuit is for the duration of one bit of the bits forming a PCM signal. In the present case, the mark time of the switch Sab may be approximately 0.5 microseconds. In response to the closing of the switch Sab a sample of the signal is supplied from the capacitor C1.

In response to the delivery of a pulse from the pulse-shaping circuit Is closing the switch Sab, the register Reg starts an operation within which all possible register stage settings appear. The triggering of the function generator FG occurring in response to the register stage settings causes the latter to deliver from its output an output voltage signal having the above mentioned nonlinear characteristic. The output voltage signal is compared in the analog comparator Vgl1 with the aforementioned sample. If the comparator Vgl1 detects a correspondence between the signals being compared, it delivers a signal "1" to the holding circuit HS, thereby setting the flipflop FF disposed therein. The flip-flop FF has been previously reset by the pulse delivered from the output of the pulse-shaping circuit Is. Due to the setting of the flip-flop FF each of the blocking elements GS1 to GS8 connected ahead of the inputs of the storage stages of the dynamic storage Spab receives an inhibiting signal. As a consequence, the train of bits or code train last coupled to said register stages and corresponding to the state of the register Reg, i.e., the train of bits which was available from the outputs of the register Reg up to the instant of delivery of the signal "1" from the analog comparator Vgl1, is retained in the dynamic storage Spab. This train of bits is so retained at least until the moment when the storage is connected over the store-out circuit comprising the AND elements Ga1 to Ga8 to the outgoing PCM transmission circuit over the output terminals a1 to a8. The code train is thus a companded code train corresponding to the analog signal which was to be converted.

Let it now be assumed that a PCM signal appearing over the incoming PCM transmission circuit at the input terminals e1 to e8 is to be converted into an analog signal to be coupled to the subscriber station Tln, taking account of a nonlinear bend characteristic. The PCM signal appearing at the input terminals e1 to e8 travels, at the moment when an output pulse appears from the pulse-shaping circuit Is over the AND elements Ge1 to Ge8, into the memory stages of the dynamic storage Span. The digital comparator Vgl2 connected to the dynamic storage Span and to the outputs of the register stages of the register Reg now compares the signals or bits delivered by it at the various positions of the register Reg with the bits in the dynamic storage Span. If the digital comparator Vgl2 detects a correspondence between the signals or bits being compared, it delivers a leading signal "1" for the purpose of closing the switch San1. The output voltage applied at this instant to the output of the function generator FG is thus stored on the capacitor D2. At the moment when the next output pulse appears from the pulse-shaping circuit, the switch San2 is closed, and this causes a signal corresponding to the voltage across the capacitor C2 to be fed over the low pass filter TS and the hybrid circuit GS. The latter signal corresponds to the expanded analog signal corresponding to the PCM signal which was to be converted.

It has been explained hereinabove how an analog signal is delivered from the subscriber station Tln is converted into a PCM signal, taking account of a nonlinear bend characteristic and how a PCM signal, taking account of such a nonlinear bend characteristic, is converted into an analog signal routed to the subscriber station Tln. The processes run independently of each other. With regard to the switching elements employed in this connection and comprising the clock generator TG, the register Reg, the pulse-shaping circuit Is, the function generator FG, and the decoder circuit Ds connected ahead of the latter, it is to be noted that the switching elements can be utilized for a multiplicity of subscriber stations. Only the remaining switching elements not listed above and in the drawing must be provided separately for each subscriber station. This is illustrated in the drawing by bracket-like multiple signs drawn in the places concerned.

In conclusion, it is to be noted that the circuit arrangement described hereinabove may be constructed in its entirety as an integrated circuit.

The preferred embodiment described hereinabove is intended only to be exemplory of the principles of the invention. It is contemplated that the described embodiment can be modified or changed in a variety of ways while remaining within the scope of the invention, as defined by the appended claims.

I claim:

1. Apparatus for converting analog signals, particularly pulse amplitude modulated (PAM) signals, into pulse code modulated (PCM) signals and for converting PCM signals into analog signals, in each case utilizing a nonlinear characteristic, comprising:
   generator means for producing a time varying voltage having a wave shape corresponding to that of said nonlinear characteristic,
   means for receiving said analog signals to be converted into PCM signals,
   analog comparator means having inputs connected, respectively, to said generator means output and to said means for receiving said analog signals for comparison and for producing an output signal voltage variable with time in accordance with said nonlinear characteristic,
   clock-actuated counter means for producing code chains corresponding to the instantaneous amplitude of the output signals from said generator means, output signals being produced from said counter means when said analog comparator means produces an output signal indicating equality between said received analog signal and the output of said generator means,
   PCM output register means for producing PCM output signals to a PCM trunk, said PCM output register being connected to receive the output from said counter means,
   PCM input register means for receiving and storing incoming PCM signals from the PCM trunk,
   digital comparator means having inputs coupled, respectively, to an output from said counter means and an output from said PCM input register means and for producing a control signal when there is equality between the output values from said counter means and said incoming PCM signals,
   first switching means for connecting an output from said generator means to an analog signal output terminal, said switching means having an operating input connected to the output of said digital comparator means so that the appearance of said control signal actuates said switching means.

2. The apparatus defined in claim 1 said clock-actuated counter means is a clock-actuated binary counter producing code chains in all combinations during each conversion cycle, the last code chain from said binary counter being utilized during each conversion cycle for the control of the output from said PCM output register means and for the control of an input into said PCM input register means.

3. The apparatus defined in claim 2 further comprising:
   second switching means for connecting an input analog signal to said analog comparator means, said second switching means being operable responsive to the last code chain from said binary counter and
   a first capacitor connected across the connection from said means for receiving analog signals to an input of said analog comparator means.

4. The apparatus defined in claim 3 further comprising:
   third switching means for connecting the output from said first switching means to said analog output terminal over a storage capacitor connected thereacross, said third switching means being operable responsive to the last code chain from said binary counter.

5. The apparatus defined in claim 1 wherein said PCM output register means is formed by a dynamic storage and further comprising:
   first write-in control for coupling an output of said counter means to an input of said PCM output register means, said first write-in control means including a holding circuit for preventing further writing-in of code chains from said counter means into said PCM output register means in response to the emission of an output signal from said analog comparator means until the appearance of the last code chain produced by said counter means during the current conversion cycle and
   read-out means for connecting the output of said PCM output register means to said PCM trunk upon appearance of said last code chain.

6. The apparatus defined in claim 1 wherien said PCM input register means is a dynamic storage and further comprising:
   second write-in control means for coupling input PCM signals from said PCM trunk to said PCM input register means upon appearance of the 7. The apparatus defined in claim 1 wherein said generator means is triggered only by bits from said counter means which correspond to quantization bits indicating sign and amplitude range of a PCM signal in accordance with said nonlinear characteristic.

8. The apparatus defined in claim 7 further comprising:
   decoder means for triggering said generator means from bits produced from said counter means which correspond to said quantization bits.

* * * * *